United States Patent [19]
Takada et al.

[11] Patent Number: 5,196,089
[45] Date of Patent: Mar. 23, 1993

[54] MULTILAYER CERAMIC SUBSTRATE FOR MOUNTING OF SEMICONDUCTOR DEVICE

[75] Inventors: Toshikatsu Takada; Ryuji Imai; Rokuro Kambe, all of Nagoya, Japan

[73] Assignee: Ngk Spark Plug Co., Ltd., Nagoya, Japan

[21] Appl. No.: 751,326

[22] Filed: Aug. 28, 1991

[30] Foreign Application Priority Data

Aug. 28, 1990 [JP] Japan ................... 2-227627
Aug. 13, 1991 [JP] Japan ................... 3-228302

[51] Int. Cl.$^5$ .................. B44C 1/22; B29C 37/00; C03C 15/00
[52] U.S. Cl. .................. 156/645; 156/655; 156/656; 156/668; 156/901; 156/663
[58] Field of Search .......... 156/636, 645, 655, 656, 156/659.1, 668, 901, 902, 663; 361/397, 400, 401

[56] References Cited

U.S. PATENT DOCUMENTS

| | | | |
|---|---|---|---|
| 4,622,058 | 11/1986 | Leary-Renick | 156/663 X |
| 4,970,106 | 11/1990 | DiStefano | 428/209 |

FOREIGN PATENT DOCUMENTS

| | | |
|---|---|---|
| 158697 | 12/1980 | Japan . |
| 193051 | 11/1982 | Japan . |
| 198795 | 11/1984 | Japan . |
| 248429 | 11/1986 | Japan . |
| 104398 | 5/1988 | Japan . |
| 108798 | 5/1991 | Japan . |

OTHER PUBLICATIONS

The International Journal for Hybrid Microelectronics, vol. 4, No. 2, Oct. 1981, cover page and pp. v–vii and 289–295.

*Primary Examiner*—William A. Powell
*Attorney, Agent, or Firm*—Cooper & Dunham

[57] ABSTRACT

In a method of fabricating a multilayered interconnection for integrated circuit package, a coating of a metallized conductive pattern is formed on an upper surface of the substrate. A plurality of vertical copper studs are formed on the substrate for an interconnection with the metallized conductive pattern. A polyimide slurry is provided on the surface of the substrate to cover each top surface of the conductive studs. An upper surface of the polyimide slurry is polished to expose each top surface of the copper studs. A masking film is provided on each top surface of the copper studs prior to supplying an intermediate derivative of a polyimide polymer. The masking film works to protect the intermediate derivative against an chemically reaction with the copper studs to avoid a chelate compound from being produced at the time of heating step followed; A coat of the intermediate derivative of the polyimide polymer is provided entirely on the polished surface of the polyimide slurry, and is heated to form a coating of a polyimide layer. Then the coating of the polyimide layer is partly removed to expose portions corresponding to each top surface of the copper studs. The masking film is removed by etching.

6 Claims, 11 Drawing Sheets

STEP 9

STEP 9

STEP 10

STEP 14

STEP 15

STEP 16

STEP 17

STEP 1
STEP 2

STEP 3

STEP 7

STEP 8

STEP 8

STEP 9

STEP 10

STEP 11

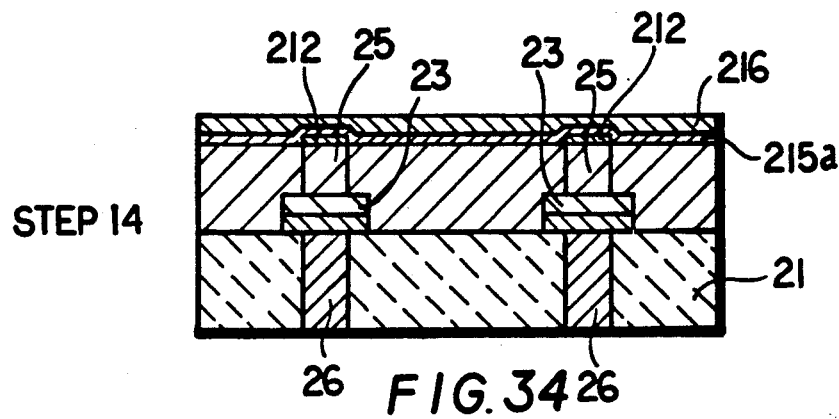
STEP 14 — FIG. 34
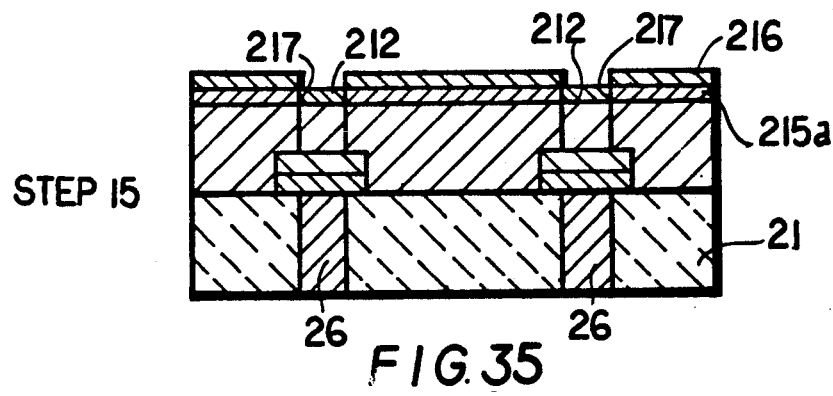
STEP 15 — FIG. 35
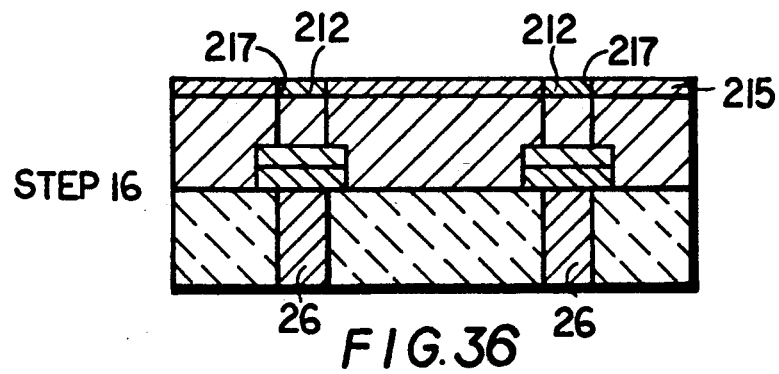
STEP 16 — FIG. 36
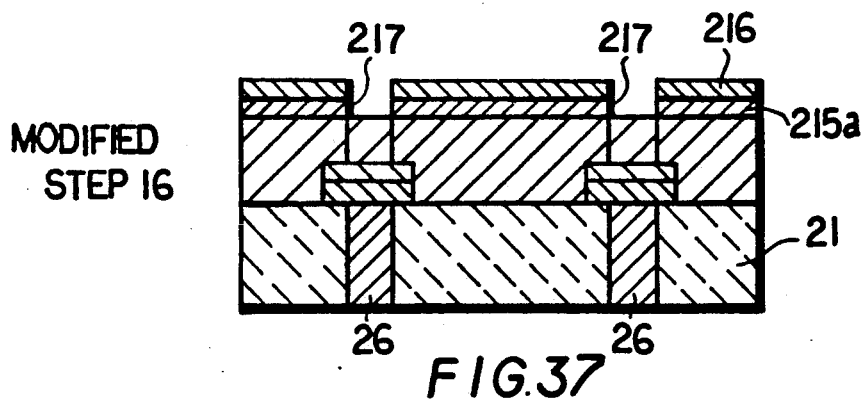
MODIFIED STEP 16 — FIG. 37

MULTILAYER CERAMIC SUBSTRATE FOR MOUNTING OF SEMICONDUCTOR DEVICE

BACKGROUND OF THE INVENTION

1. Field of the Invention

The invention related to semiconductor packages and more particularly to a multilayer polymer metal package which has a polyimide insulation layer and vertical interconnection studs which are made of copper.

2. Description of Prior Art

In a Patent Provisional Publication No. 61-248429, there is provided a superstructure comprising multi-levels or planes separated by a plurality of polyimide insulation layers in which vertical interconnections between different levels and a multilayer ceramic substrate are made by a plurality of electrically conductive studs.

On the multilayer ceramic substrate, a coating of a polyimide layer is formed to provide a first metallized conductive pattern thereon. On the polyimide layer, a plurality of copper studs is provided by means of electroplating for an interconnection with the first metallization pattern. A polyamide slurry, which is an intermediate derivative of polyimide polymer, is coated on an entire surface of the ceramic substrate in a manner to cover each top surface of the copper studs. The polyamide slurry is heated and cured to form a coating of a polyimide layer.

After polishing the coating surface of the polyimide layer, an etching operation exposes each top surface of the copper studs. On the polished surface of the polyimide layer, a second metallized conductive pattern is coated by means of sputtering. Thereafter the process is repeatable so as to provide any number of desired levels of metallization.

The polished surface of the polyimide layer, however, is very susceptible to injury so as to render the sputtered pattern difficult to tightly adhere to the surface of the polyimide layer.

At the process of coating the intermediate derivative of polyimide polymer, the derivative (polyamide) chemically react with the top surface of the copper studs to form a chelate compound. The chelate compound has relatively great resistance so that an increased impedance is presented in electrical paths interconnected through the copper studs.

Therefore, it is an object of the invention to provide a method which is capable of sputtering metallized conductive pattern tightly on the surface of the polyimide layer.

It is another object of the invention to provide a method which is capable of preventing a chelate compound from being produced on each top surface of copper studs.

SUMMARY OF THE INVENTION

According to the present invention, there is provided a fabricating method comprising steps of: providing a substrate made of ceramic material with alumina and aluminum nitride as main compositions; forming a coating of a metallized conductive pattern on an upper surface of the substrate; forming a plurality of vertical conductive studs on the substrate for an interconnection with the metallized conductive pattern, the vertical conductive studs being made of copper respectively; providing a polyimide slurry on the surface of the substrate in a manner to cover each top surface of the conductive studs; polishing an upper surface of the polyimide slurry to expose each top surface of the conductive studs; providing a masking film on each top surface of the conductive studs prior to supplying an intermediate derivative of a polyimide polymer, the masking film working to protect the intermediate derivative against an chemically reaction with the conductive studs to avoid a chelate compound from being produced at the time of heating step followed; providing a coat of the intermediate derivative of the polyimide polymer entirely on the polished surface of the polyimide slurry; heating the intermediate derivative to from a coating of a polyimide layer; partly removing the coating of the polyimide layer to expose portions corresponding to each top surface of the conductive studs so as to form openings on the portions corresponding to each top surface of the conductive studs; and removing the masking film located at the openings by means of etching.

According to another invention, there is provided a fabricating method comprising steps of: providing a substrate made of ceramic material with alumina and aluminum nitride as main compositions; forming a coating of a metallized conductive pattern on an upper surface of the substrate; forming a plurality of vertical conductive studs on the substrate for an interconnection with the metallized conductive pattern, the vertical conductive studs being made of copper respectively; providing a polyimide slurry on the surface of the substrate in a manner to cover each top surface of the conductive studs; polishing an upper surface of the polyimide slurry to expose each top surface of the conductive studs; providing a masking film on each top surface of the conductive studs prior to supplying an intermediate derivative of a polyimide polymer, the masking film working to protect the intermediate derivative against an chemically reaction with the conductive studs to avoid a chelate compound from being produced at the time of heating step followed; providing a cost of the intermediate derivative of the polyimide polymer entirely on the polished surface of the polyimide slurry; removing the masking film portions which correspond to each top surface of the conductive studs; and heating the intermediate derivative to form a coating of a polyimide layer.

The structure is such that after a polyimide layer is further coated on the polished surface of the polyimide insulation polymer, second metallized conductive pattern is provided instead of directly depositing the second metallized conductive pattern on the polished surface of the polyimide insulation polymer.

This enables to tightly adhere the second metallized conductive pattern to the surface of the polyimide layer because it is smoother than the polished surface of the polyimide insulation polymer.

Further coating of the masking film makes it possible to prevent the derivative of polyimide from reacting with the copper studs, and thus avoiding chelate compound from being produced on the top surface of copper studs. The following etching operation removes the masking film through the opening.

With no chelate compound produced on the top surface of the copper studs, it is possible to insure a minimum impedance in electrical paths interconnected through the copper studs.

Various other objects and advantages to be obtained by the present invention will appear in the following description and in the accompanying drawings.

BRIEF DESCRIPTION OF THE DRAWINGS

FIGS. 19 through 36 are schematic step-by-step cross-sectional views illustrating a second embodiment of the invention for fabricating metal-to-insulation portion of an interconnection package; and FIG. 37 is a schematic cross-sectional view according to a modified form of the second embodiment of the invention.

DETAILED DESCRIPTION OF THE EMBODIMENTS

Step 1

Referring to FIGS. 1 through 18 which shows a first embodiment of the invention, a substrate 1 comprises a plurality of laminated green sheets each made of ceramic material with alumina and aluminum nitride as main components. The laminated green sheets are sintered in a wet atmosphere of hydrogen gas, and are separated by metallized conductive patterns although not shown because it is conventional.

A metal-to-insulation superstructure 4 comprises multi-levels or planes separated by a plurality of polyimide layers and metallized conductive patterns 3 as described hereinafter in FIG. 18. The superstructure 4 has a plurality of copper studs 5 which provide electrical interconnections between the metallized conductive patterns 3 and those provided on the superstructure 4. Thus, the copper studs 5 form electrical conductive paths between integrated circuit chips on the package and the metallized conductive patterns provided in the substrate 1.

Step 2

Figure 1:
FIGS. 1 through 18 are schematic step-by-step cross-sectional views illustrating a first embodiment of the invention for fabricating metal-to-insulation portion of an interconnection package.

A polyamide polymer is prepared by a spin coater to present a predetermined viscosity an intermediate derivative of polyimide slurry. The derivative is coated on a polished surface of the substrate 1. Then, the derivative is heated and cured to form a polyimide insulation layer 6 which is e.g. 25 $\mu$m in thickness. The coating of the polyimide insulation layer 6 covers the polished surface of the substrate 1 to present a smooth surface of the layer 6 as shown in FIG. 1.

Step 3

Figure 2:
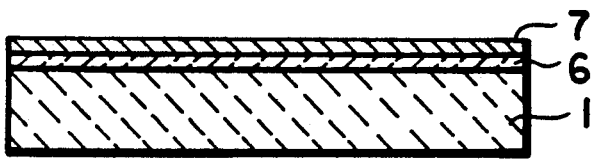

On the surface of the polyimide insulation layer 6, is a blanket layer 7 consisting of lower and upper films deposited by means of sputtering as shown in FIG. 2. The lower film is chromium 500 Å in thickness, while the upper film is copper 5000 Å in thickness.

Step 4

Figure 3:
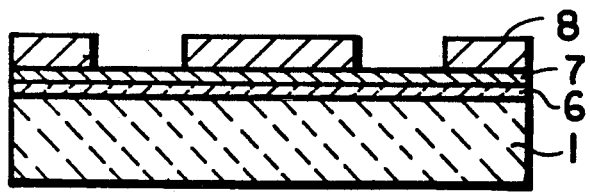
Figure 4:
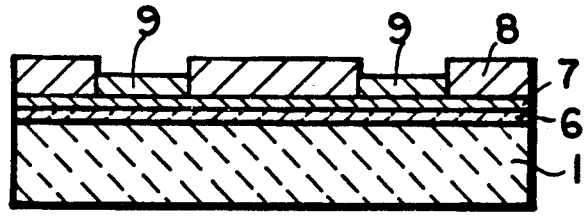

On the blanket layer 7, is a photoresist mask 8 deposited which thereafter is photolithographically treated as shown in FIG. 3. Subsequent etching operation on the photoresist mask 8 removes its portions only corresponding to the metallized conductive pattern 3 (see FIG. 7).

Step 5

A conductive layer 9 is deposited on the portions in which the photoresist mask 8 is removed. The conductive layer 9 consists of lower and upper films which are deposited by means of electroplating. The lower film is copper of 5 $\mu$m in thickness, while the upper film is nickel of 1 $\mu$m in thickness (see FIG. 4).

Step 6

Figure 5:
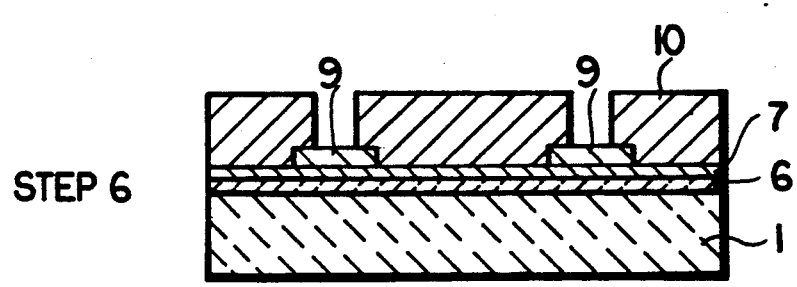

After the rest of the photoresist mask 8 is removed, another photoresist mask 10 deposited on an entire surface of the blanket layer 7. After the photoresist mask 10 is photolithographically treated, subsequent etching operation on the photoresist mask 10 removes masking portions corresponding to those on which the copper studs 5 are to be deposited as shown in FIG. 5.

Step 7

Figure 6:
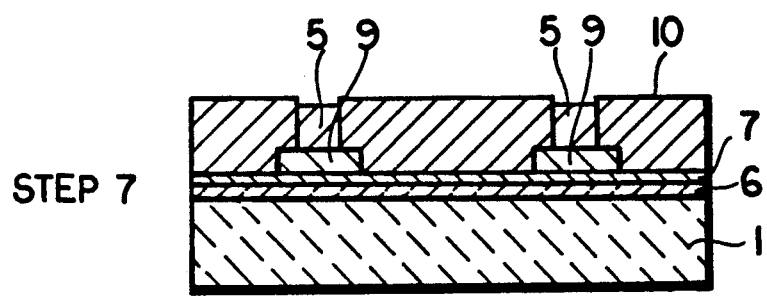

The copper studs 5 are deposited by means of electroplating on the portions in which the photoresist mask 10 is removed as shown in FIG. 6. In this process, the nickel film of the conductive layer 9 is employed as a cathode for the electroplating process used to deposit the copper studs 5. Each of the copper studs 5 measures 20 $\mu$m in height and 20~200 $\mu$m in diameter.

Step 8

Figure 7:
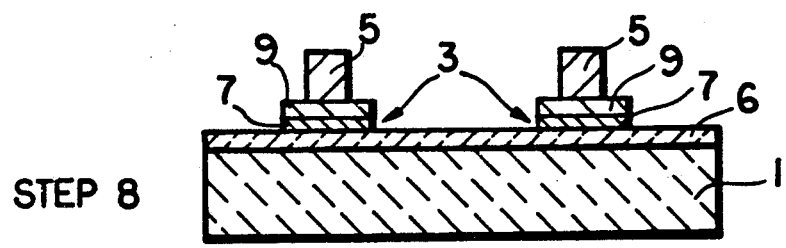

After the rest of the photoresist masks 8, 10, subsequent etching operation on the blanket layer 7 makes it possible to remove portions corresponding to those on which the copper studs 5 are deposited as shown in FIG. 7. In this Step 8, the metallized conductive pattern 3 is formed by the unremoved portions of the blanket layer 7 and the conductive layer 9.

Step 9

A polyamide polymer is prepared by a spin coater to provide an intermediate derivative 11a of polyimide slurry with a predetermined viscosity in the same manner as described in Step 2.

Figure 8:
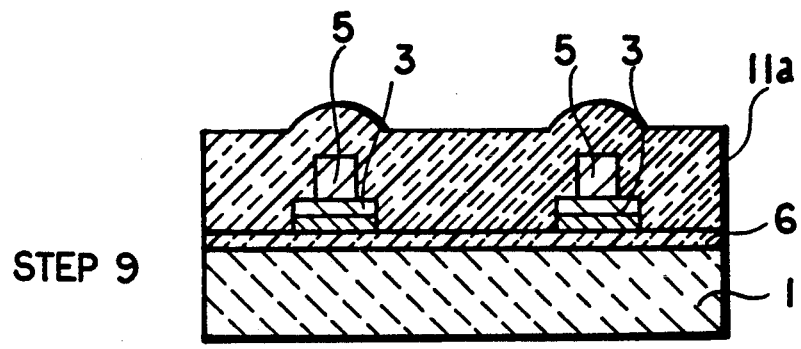
Figure 9:
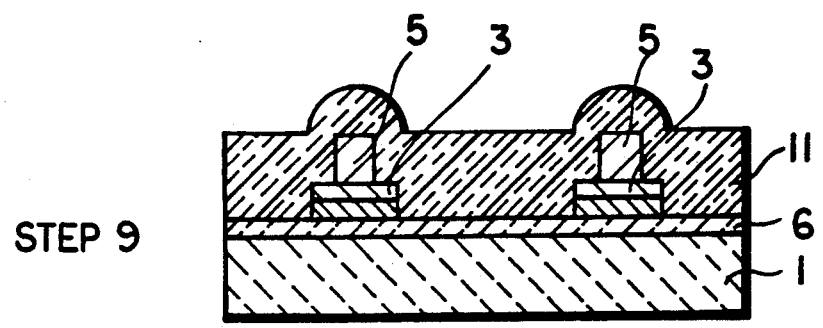

The intermediate derivative 11a is coated on an entire surface of the polyimide insulation layer to cover each top surface of the copper studs 5 as shown in FIG. 8. After the derivative 11a is heated, it is cured to form a polyimide polymer 11 as shown in FIG. 9.

Step 10

Figure 10:
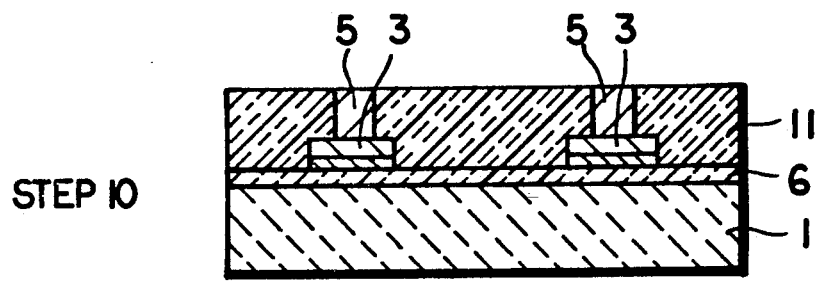

An entire surface of the polyimide polymer 11 is polished by means of lapping to expose each top surface of the copper studs 5 as shown in FIG. 10.

Step 11

Figure 11:
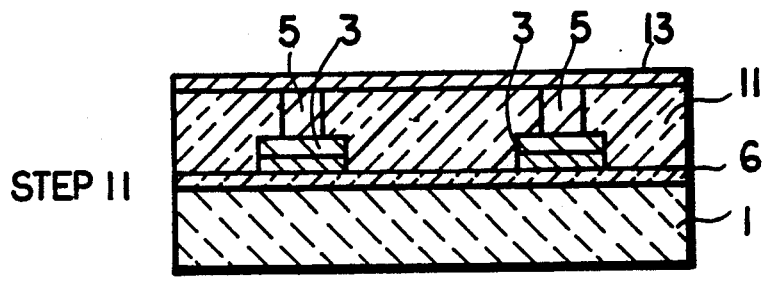

On the polished surface of the polyimide polymer 11, is a protective layer 13 coated as shown in FIG. 11. The protective layer 13 is adapted to resultantly serve as masking film lands 12, and is made of a metal selected from the group consisting of titanium (Ti), chromium (Cr), nickel (Ni), palladium (Pd) and platinum (Pt).

The protective layer 12 works to prevent the derivative of the polyimide polymer from chemically reacting with the copper studs 5, and thus avoiding the chelate compound from being produced.

In addition, the protective layer 12 is such selected at its material as to be readily removed by means of etching operation.

Step 12

Figure 12:
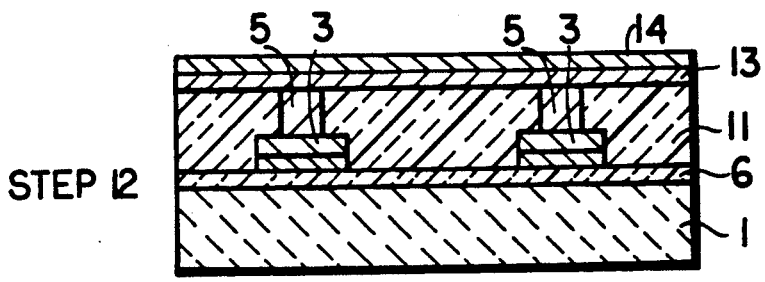

On a surface of the protective layer 13, is a photoresist mask 14 coated as shown in FIG. 12.

Step 13

Figure 13:
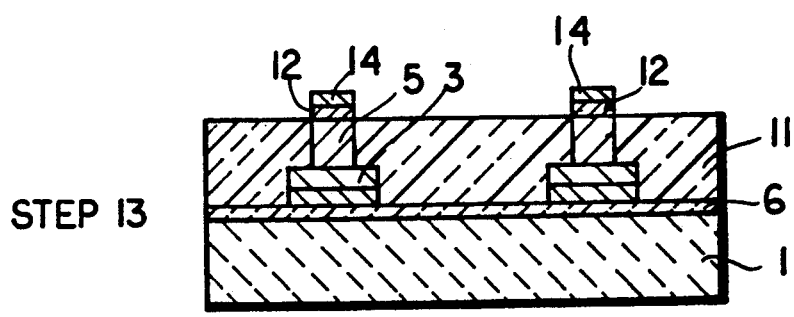
Figure 14:
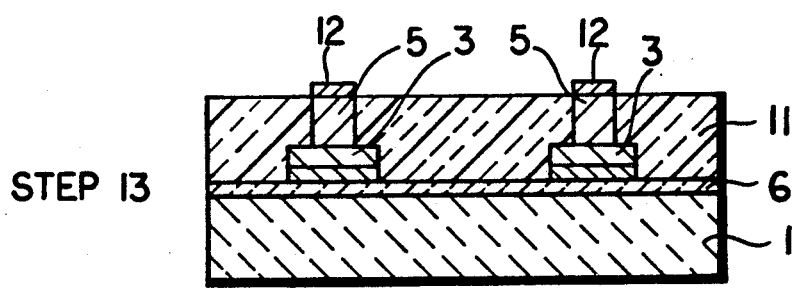

After, the photoresist mask 14 is photolithographically treated, an etching operation on the photoresist mask 14 leaves portions merely corresponding to the top surface of the copper studs 5. Further etching operation on the protective layer 13 leaves portions merely corresponding to the top surface of the copper studs 5 as shown in FIG. 13. Then the portions 14 in which the photoresist mask leaves on the top surface of the copper studs 5, is removed to form the masking film lands 12 as shown in FIG. 14.

Step 14

Figure 15:
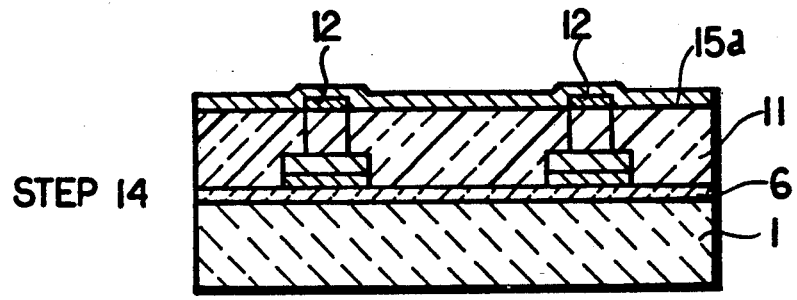

On the polished surface of the polyimide polymer 11, its derivative 15a is thinly coated, and is soft-baked at the temperature of 140 degree Celsius for 30 minutes to have 1200 cP in its viscosity as shown in FIG. 15. In this instance, the soft-baking means to carry out removing an organic solvent either partly or entirely in which the derivative 15a is dissolved.

Step 15

Figure 16:
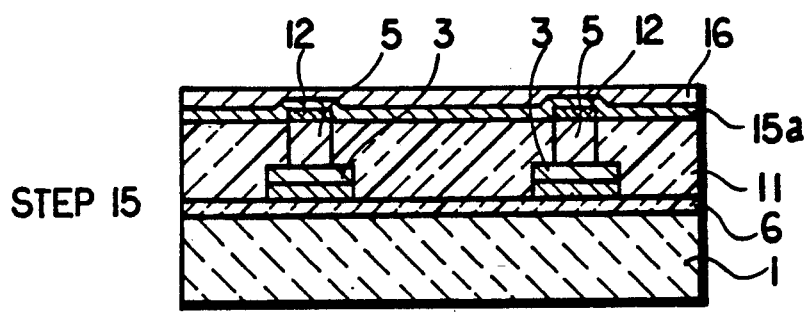

On a surface of the soft-baked derivative 15a, is a photoresist mask 16 coated as shown in FIG. 16.

Step 16

Figure 17:
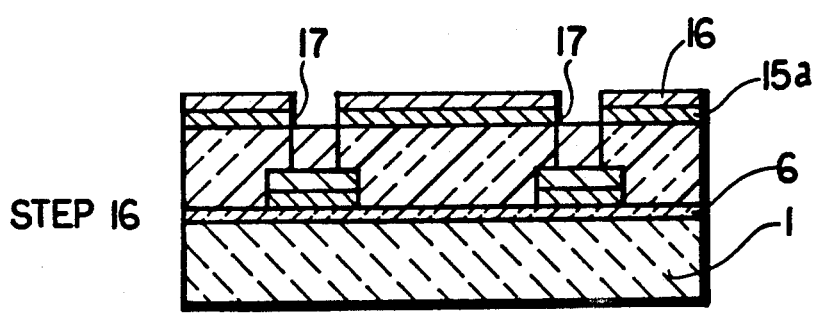

After the photoresist mask 16 is photolithographically treated, an etching operation on the photoresist mask 16 leaves portions merely corresponding to the top surface of the copper studs 5 so as to form openings 17. Further etching operation removes the masking film lands 12 by way of the openings 17 so as to form the superstructure 4 as shown in FIG. 17.

Step 17

Figure 18:
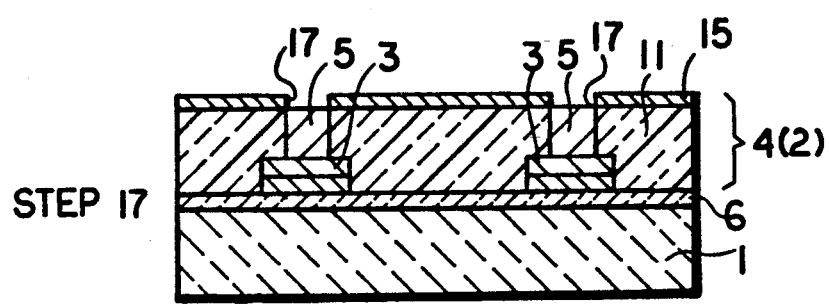

After the rest of photoresist mask 16 is removed, the derivative 15a is heated and cured to form a polyimide insulation layer 15 on the polished surface of the polyimide polymer 11 as shown in FIG. 18. The polished surface of the polyimide polymer 11 is replaced by the polyimide insulation layer 15 which has a smooth plane at its upper surface. By way of example, the polyimide insulation layer 15 measures 2~5 μm in thickness. With the polyimide polymer 11 and the polyimide insulation layer 15, the integrated insulation 2 is made in the superstructure 4. After Step 17, the process is repeatable to provide any number of desired levels of the metallization.

Referring to FIGS. 19 through 36 which shows a second embodiment of the invention, a substrate 21 comprises a plurality of laminated green sheets each made of ceramic material with alumina and aluminum nitride as main components. The laminated green sheets are sintered in a wet atmosphere of hydrogen gas, and are separated by metallized conductive patterns as described in the first embodiment of the invention.

Figure 19:
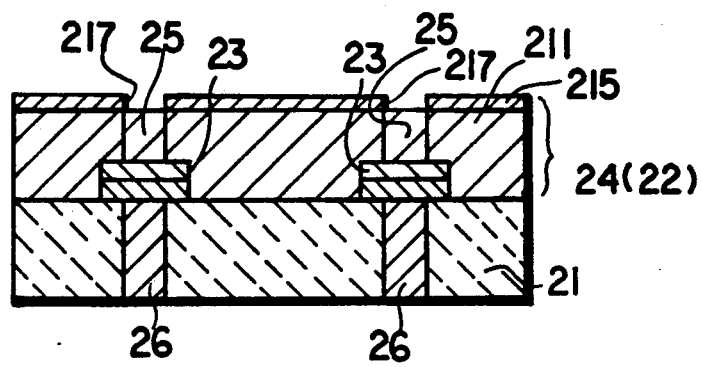

A metal-to-insulation superstructure 24 comprises multi-levels or planes separated by a plurality of polyimide layers and metallized conductive patterns 23 as described in FIG. 19. The superstructure 24 has a plurality of copper studs 25 which provide electrical interconnections between the metallized conductive patterns 23 and those provided on the superstructure 24. Thus, the copper studs 25 form electrical conductive paths between integrated circuit chips on the package and the metallized conductive patterns 26 provided in the substrate 21.

The superstructure 24 as a multi-layer substrate package is manufactured as the following steps.

Step 1

Figure 20:
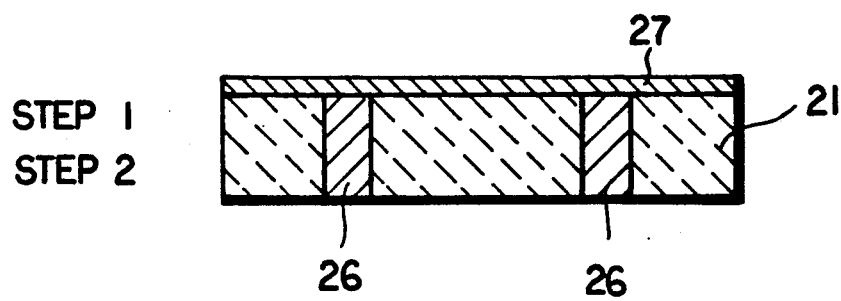

An upper surface of the substrate 21 is polished to make it smooth as shown in FIG. 20.

Step 2

On the surface of the substrate 21, is a blanket layer 27 which consists of lower and upper films deposited by means of sputtering as shown in FIG. 20. The lower film is titanium of 1000 Å in thickness, while the upper film is copper of 5000 Å in thickness by way of example. In this instance, the lower film may be copper instead of titanium.

Step 3

Figure 21:
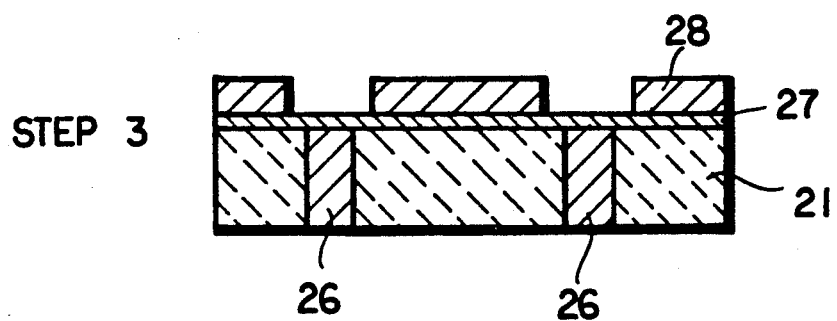
Figure 22:
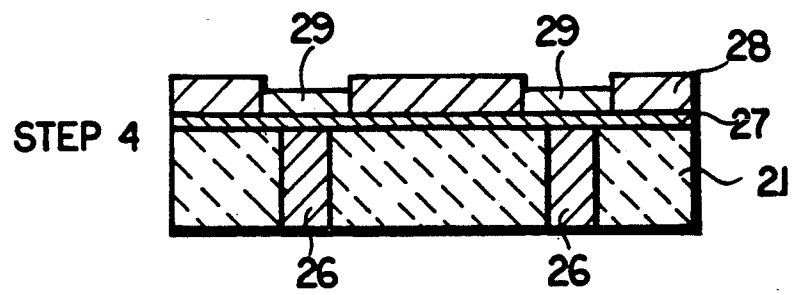
Figure 23:
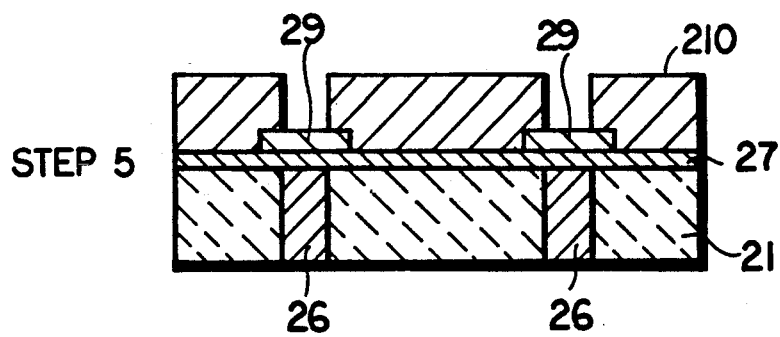

On the blanket layer 27, is a photoresist mask 28 deposited which thereafter is photolithographically treated as shown in FIG. 21. Subsequent etching operation on the photoresist mask 28 removes its portions only corresponding to the metallized conductive pattern 23 (see FIG. 25).

Step 4

A conductive layer 29 is deposited on the portions in which the photoresist mask 28 is removed. The conductive layer 29 consists of lower and upper films which are deposited by means of electroplating. The lower film is copper of 5 μm in thickness, while the upper film is nickel of 1 μm in thickness by way of illustration (see FIG. 22).

Step 5

After the rest of the photoresist mask 28 is removed, another photoresist mask 210 deposited on an entire surface of the blanket layer 27. After the photoresist mask 210 is photolithographically treated, subsequent etching operation on the photoresist mask 210 removes masking portions corresponding to those on which the copper studs 25 are to be deposited as shown in FIG.

Step 6

Figure 24:
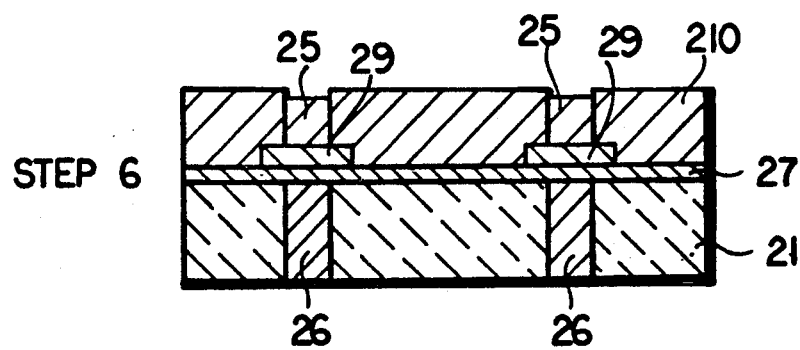

The copper studs 25 are deposited by means of electroplating on the portions in which the photoresist mask 210 is removed as shown in FIG. 24. In this process, the nickel film of the conductive layer 29 is employed as a cathode for the electroplating process used to deposit the copper studs 25 in the same manner as described in the first embodiment of the invention. Each of the copper studs 25 measures 20 μm in height and 20 ~200 μm in diameter.

Step 7

Figure 25:
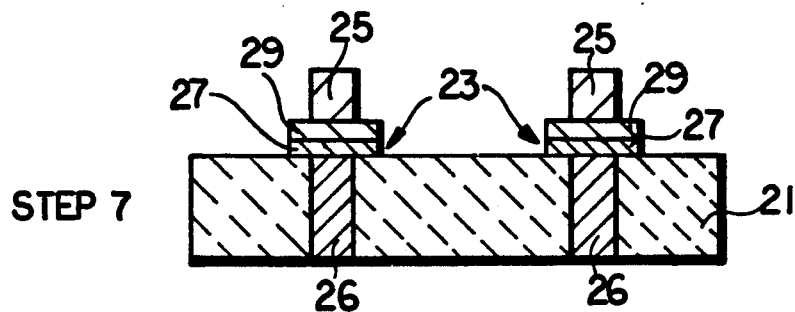

After the rest of the photoresist masks 28, 210, subsequent etching operation on the blanket layer 27 makes it possible to remove portions corresponding to those on which the copper studs 25 are deposited as shown in FIG. 25. In this Step 7, the metallized conductive pattern 23 is formed by the unremoved portions of the blanket layer 27 and the conductive layer 29.

Step 8

A polyamide polymer is prepared by a spin coater to provide an intermediate derivative 211a of polyimide slurry with a predetermined viscosity.

Figure 26:
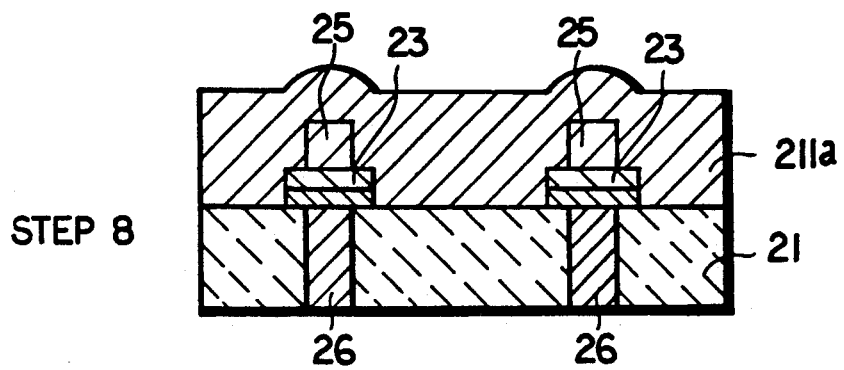
Figure 27:
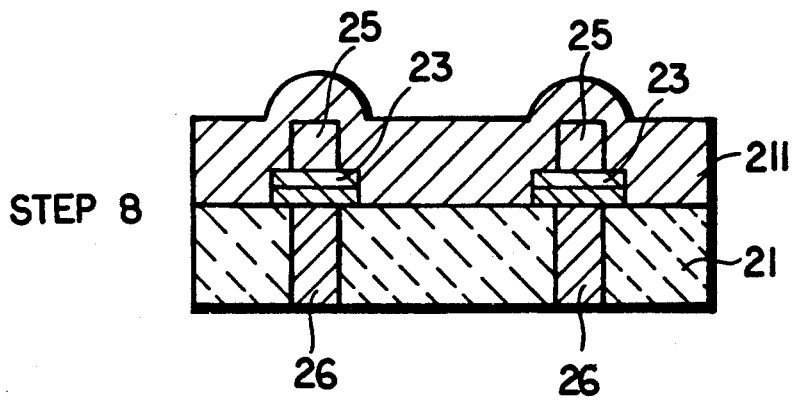

The intermediate derivative 211a is coated on an entire surface of the ceramic substrate 21 to cover each top surface of the copper studs 25 as shown in FIG. 26. After the derivative 211a is heated, it is cured to form a polyimide polymer 211 as shown in FIG. 27.

Step 9

Figure 28:
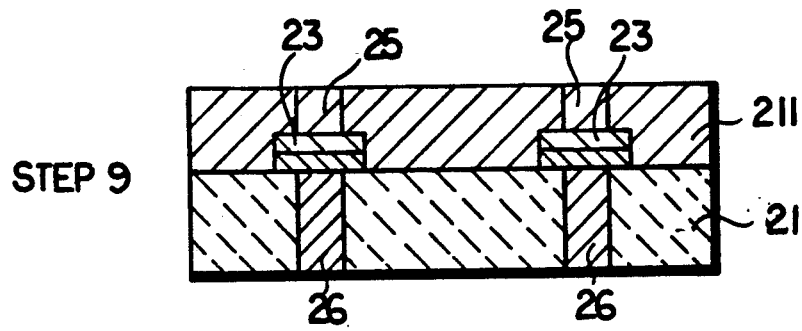

An entire surface of the polyimide polymer 211 is polished by means of lapping to expose each top surface of the copper studs 25 as shown in FIG. 28.

Step 10

Figure 29:
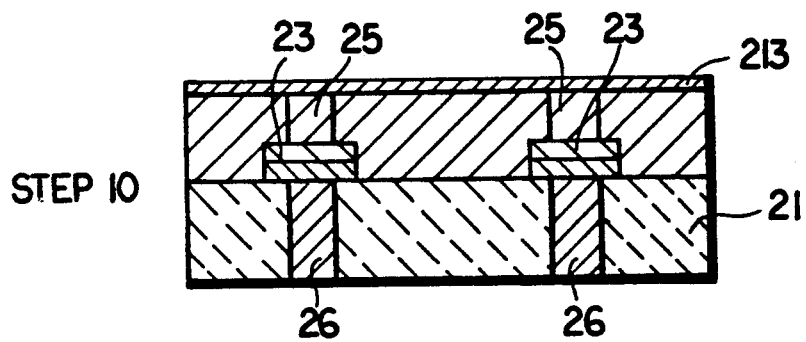

On the polished surface of the polyimide polymer 211, is a protective layer 213 coated as shown in FIG. 29. The protective layer 213 is adapted to resultantly serve as masking film lands 212, and is made of a metal selected from the group consisting of titanium (Ti), chromium (Cr), nickel (Ni), palladium (Pd) and platinum (Pt) as described in the first embodiment of the invention.

The protective layer 213 works to prevent the derivative of the polyimide polymer from chemically reacting with the copper studs 25, and thus avoiding the chelate compound from being produced.

In addition, the protective layer 212 is such selected at its material as to be readily removed by means of etching operation.

Step 11

Figure 30:
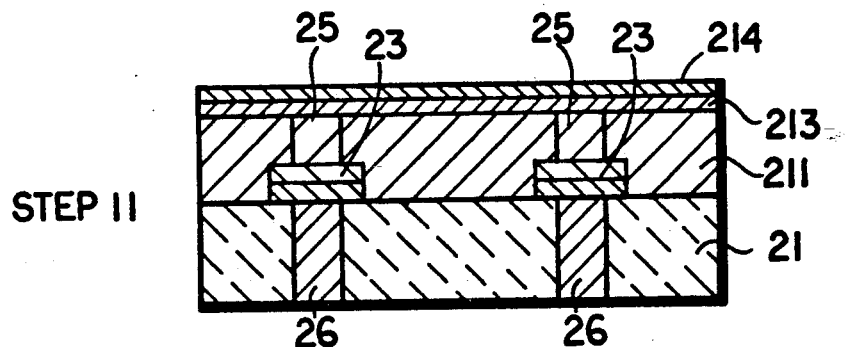

On a surface of the protective layer 213, is a photoresist mask 214 coated as shown in FIG. 30.

Step 12

Figure 31:
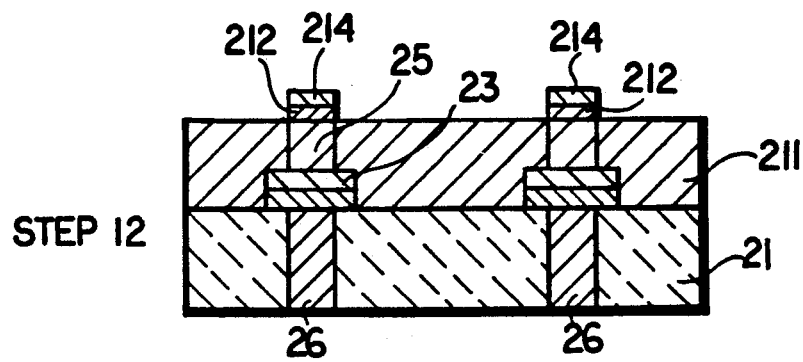
Figure 32:
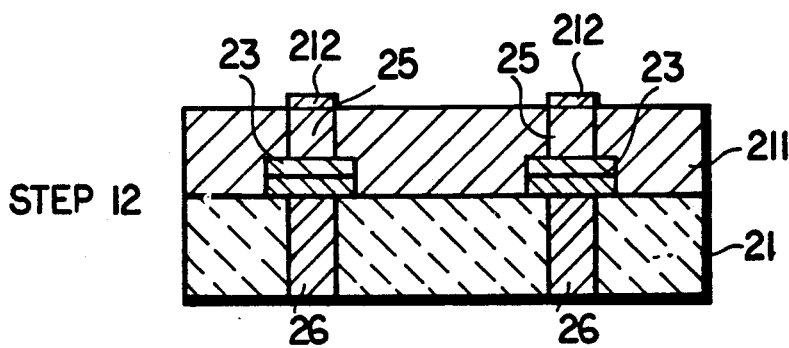

After, the photoresist mask 214 is photolithographically treated, an etching operation on the photoresist mask 214 leaves portions merely corresponding to the top surface of the copper studs 25. Further etching operation on the protective layer 213 leaves portions merely corresponding to the top surface of the copper studs 25 as shown in FIG. 31. Then the portions 214 in which the photoresist mask leaves on the top surface of the copper studs 25, is removed to form the masking film lands 212 as shown in FIG. 32.

Step 13

Figure 33:
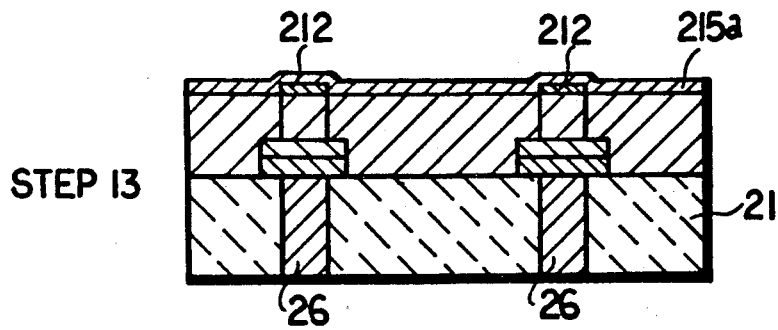

On the polished surface of the polyimide polymer 211, its derivative 215a is thinly coated, and is soft-baked at the temperature of 140 degrees Celsius for 30 minutes to have 1200 cP in its viscosity as shown in FIG. 33.

Step 14

On a surface of the soft-baked derivative 215a, is a photoresist mask 216 as shown in FIG. 34.

Step 15

After the photoresist mask 216 is photolithographically treated, an etching operation on the photoresist mask 216 leaves portions merely corresponding to the top surface of the copper studs 25 so as to form openings 217. Further etching operation removes the masking film lands 212 by way of the openings 217 so as to form the superstructure 24 as shown in FIG. 35.

Step 16

After the rest of photoresist mask 216 is removed, the derivative 215a is heated and cured to form a polyimide insulation layer 215 on the polished surface of the polyimide polymer 211 as shown in FIG. 36. The polished surface of the polyimide polymer 211 is replaced by the polyimide insulation layer 215 which has a smooth plane at its upper surface. By way of example, the polyimide insulation layer 215 measures 2~5 μm in thickness. With the polyimide polymer 211 and the polyimide insulation layer 215, the integrated insulation 22 is made in the superstructure 24. After step 16, the process is repeatable to provide any number of desired levels of the metallization.

As a modified form of the second embodiment of the invention, step 16 may be used as shown in FIG. 37 instead of the step shown in FIG. 36. In the modified step 16, the protective layer 212 is selectively etched to remove masking portions to which the top surface of the studs 25 correspond. After removing the photoresist mask 216, the derivative 215a is heated and cured to form the polyimide layer as shown in FIG. 19.

As understood from the foregoing description, the formation the polyimide insulation layer makes it possible to tightly adhere the blanket layer to the surface of the layer as opposed to the case in which the layer is coated on the polished surface of the polyimide polymer.

Further the masking film lands makes it possible to prevent the derivative of polyimide from reacting with the copper studs, and thus avoiding chelate compound from being produced on the top surface of copper studs.

With no chelate compound produced on the top surface of the copper studs, it is possible to insure a minimum impedance in electrical paths interconnected through the copper studs.

It is noted that the masking film lands may be made the copper studs by means of electroplating or electroless plating instead of the photolithographical means.

It is also appreciated that each size of the copper studs, the blanket layer and conductive layer is not construed in a limiting sense, and each size may be selectively determined as desired.

While the invention has been described with reference to the specific embodiments, it is understood that various modifications and additions to the specific embodiments may be made by skilled artisan without departing from the spirit and scope of the invention.

What is claimed is:

1. A method for fabricating an integral metal-to-metal electrical interconnection package adapted for bonding to semiconductor integrated circuit chips, said method comprising the steps of:

providing a substrate made of ceramic material with alumina and aluminum nitride as main compositions;

forming a coating of a metallized conductive pattern on an upper surface of the substrate;

forming a plurality of vertical conductive studs on the substrate for an interconnection with the metallized conductive pattern, each of said vertical conductive studs being made of copper;

providing a polyimide slurry on the surface of the substrate in a manner to cover each top surface of the conductive studs;

polishing an upper surface of the polyimide slurry to expose each top surface of the conductive studs;

providing a masking film on each top surface of the conductive studs prior to supplying an intermediate derivative of a polyimide polymer, the masking film working to protect the intermediate derivative against a chemical reaction with the conductive studs to avoid production of a chelate compound at the time of a subsequent heating step;

providing a coat of the intermediate derivative of the polyimide polymer entirely on the polished surface of the polyimide slurry;

heating the intermediate derivative to form a coating of a polyimide layer;

partly removing the coating of the polyimide layer to expose portions corresponding to each top surface of the conductive studs so as to form openings on the portions corresponding to each top surface of the conductive studs; and removing the masking film located at the openings by means of etching.

2. A method of fabricating an integral metal-to-metal electrical interconnection package adapted for bonding to semiconductor integrated circuit chips as recited in claim 1, wherein the masking film is made of a metal selected from the group consisting of titanium (Ti), chromium (Cr), nickel (Ni), palladium (Pd) and platinum (Pt).

3. A method of fabricating an integral metal-to-metal electrical interconnection package adapted for bonding to semiconductor integrated circuit chips as recited in claim 1, wherein the conductive studs are made by means of electroplating to measure 20 μm in height and 20~200 μm in diameter.

4. A method of fabricating an integral metal-to-metal electrical interconnection package adapted for bonding to semiconductor integrated circuit chips, said method comprising the steps of:

providing a substrate made of ceramic material with alumina and aluminum nitride as main compositions;

forming a coating of a metallized conductive pattern on an upper surface of the substrate;

forming a plurality of vertical conductive studs on the substrate for an interconnection with the metallized conductive pattern, each of said vertical conductive studs being made of copper;

providing a polyimide slurry on the surface of the substrate in a manner to cover each top surface of the conductive studs;

polishing an upper surface of the polyimide slurry to expose each top surface of the conductive studs;

providing a masking film on each top surface of the conductive studs prior to supplying an intermediate derivative of a polyimide polymer, the masking film working to protect the intermediate derivative against a chemical reaction with the conductive studs to avoid production of a chelate compound at the time of a subsequent heating step;

providing a coat of the intermediate derivative of the polyimide polymer entirely on the polished surface of the polyimide slurry;

removing the masking film portions which correspond to each top surface of the conductive studs; and heating the intermediate derivative to form a coating of a polyimide layer.

5. A method of fabricating an integral metal-to-metal electrical interconnection package adapted for bonding to semiconductor integrated circuit chips as recited in claim 4, wherein the masking film is made of a metal selected from the group consisting of titanium (Ti), chromium (Cr), nickel (Ni), palladium (Pd) and platinum (Pt).

6. A method of fabricating an integral metal-to-metal electrical interconnection package adapted for bonding to semiconductor integrated circuit chips as recited in claim 4, wherein the conductive stud is made by means of electroplating to measure 20 μm in height and 20~200 μm in diameter.

* * * * *